US012672302B2

(12) United States Patent
Guo et al.

(10) Patent No.: US 12,672,302 B2
(45) Date of Patent: Jun. 30, 2026

(54) BARRIER STRUCTURE FOR DISPERSION REDUCTION IN TRANSISTOR DEVICES

(71) Applicant: Wolfspeed, Inc., Durham, NC (US)

(72) Inventors: Jia Guo, New Hill, NC (US); Kyle Bothe, Cary, NC (US); Olof Tornblad, San Jose, CA (US); Scott Sheppard, Chapel Hill, NC (US)

(73) Assignee: Wolfspeed, Inc., Durham, NC (US)

( * ) Notice: Subject to any disclaimer, the term of this patent is extended or adjusted under 35 U.S.C. 154(b) by 711 days.

(21) Appl. No.: 17/951,708

(22) Filed: Sep. 23, 2022

(65) Prior Publication Data

US 2024/0105823 A1     Mar. 28, 2024

(51) Int. Cl.
| | |
|---|---|
| *H10D 30/47* | (2025.01) |
| *H10D 62/824* | (2025.01) |
| *H10D 62/85* | (2025.01) |
| *H10D 62/82* | (2025.01) |
| *H10D 62/832* | (2025.01) |

(52) U.S. Cl.
CPC ......... *H10D 30/475* (2025.01); *H10D 62/824* (2025.01); *H10D 62/8503* (2025.01); *H10D 62/82* (2025.01); *H10D 62/8325* (2025.01)

(58) Field of Classification Search
CPC .. H10D 30/471; H10D 30/472; H10D 30/473; H10D 30/4732; H10D 30/4735; H10D 30/4738; H10D 30/474; H10D 30/475; H10D 30/4755; H10D 30/476; H10D 30/477; H10D 30/478; H10D 30/47
See application file for complete search history.

(56) References Cited

U.S. PATENT DOCUMENTS

| | | | |
|---|---|---|---|
| 6,548,333 B2 | 4/2003 | Smith | |
| 6,777,278 B2 | 8/2004 | Smith | |
| 6,849,882 B2 | 2/2005 | Chavarkar et al. | |
| 7,170,111 B2 | 1/2007 | Saxler | |
| 7,456,443 B2 | 11/2008 | Saxler et al. | |
| 7,709,859 B2 | 5/2010 | Smith et al. | |
| 9,166,033 B2 | 10/2015 | Saxler et al. | |
| 10,971,612 B2 | 4/2021 | Bothe et al. | |
| 2002/0167023 A1* | 11/2002 | Chavarkar | H10D 30/4732 |
| | | | 257/192 |
| 2009/0050938 A1* | 2/2009 | Miyoshi | H10D 30/015 |
| | | | 257/E21.403 |
| 2013/0134439 A1 | 5/2013 | Miyoshi et al. | |

(Continued)

OTHER PUBLICATIONS

International Search Report and Written Opinion for Application No. PCT/US2023/033452, mailed Jan. 15, 2024, 13 pages.

*Primary Examiner* — Eric A. Ward
(74) *Attorney, Agent, or Firm* — Dority & Manning, P.A.

(57) ABSTRACT

Transistor devices are provided. In one example, the transistor device includes a channel layer. The transistor device includes a multilayer barrier structure on the channel layer. The multilayer barrier structure includes a first Group III-nitride layer and a second Group III-nitride layer on the first Group III-nitride layer and opposite to the channel layer. The first Group III-nitride layer has a thickness greater than a thickness of the second Group III-nitride layer. An aluminum concentration of the first Group III-nitride layer is at least two times greater than an aluminum concentration of the second Group III-nitride layer.

24 Claims, 6 Drawing Sheets

(56)          References Cited

U.S. PATENT DOCUMENTS

| 2014/0103459 | A1* | 4/2014 | Kinoshita | H10D 30/60 |
| | | | | 438/285 |
| 2014/0203289 | A1* | 7/2014 | Liu | H10D 64/602 |
| | | | | 438/172 |
| 2015/0357454 | A1 | 12/2015 | Lutgen et al. | |
| 2019/0385846 | A1* | 12/2019 | Fukuhara | H10D 62/8503 |
| 2020/0098907 | A1* | 3/2020 | Liu | H10D 30/4735 |
| 2021/0384339 | A1 | 12/2021 | Sun et al. | |
| 2022/0320326 | A1* | 10/2022 | Cheng | H10D 62/824 |

* cited by examiner

BARRIER STRUCTURE FOR DISPERSION REDUCTION IN TRANSISTOR DEVICES

FIELD

The present disclosure relates generally to semiconductor devices, and more particularly to transistor devices.

BACKGROUND

Power semiconductor devices are widely used to carry large currents, support high voltages and/or operate at high frequencies such as radio frequencies. A wide variety of power semiconductor devices are available for different applications including, for example, power switching devices and power amplifiers. Many power semiconductor devices are implemented using various types of field effect transistors (FETs) devices including MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally diffused metal-oxide semiconductor) transistors, etc.

Power semiconductor devices may be fabricated from wide bandgap semiconductor materials (e.g., having a bandgap greater than 1.40 eV). For example, power HEMTs may be fabricated from gallium nitride (GaN) or other Group III nitride-based material systems that are formed, for instance, on a silicon carbide (SiC) substrate or other substrate. As used herein, the term "Group III nitride" refers to those semiconducting compounds formed between nitrogen and the elements in Group III of the periodic table, usually aluminum (Al), gallium (Ga), and/or indium (In). These compounds have empirical formulas in which one mole of nitrogen is combined with a total of one mole of the Group III elements. For high power, high temperature, and/or high frequency applications, devices formed in wide bandgap semiconductor materials such as silicon carbide (e.g., 2.996 eV bandgap for alpha silicon carbide at room temperature) and the Group III-nitrides (e.g., 3.36 eV bandgap for gallium nitride at room temperature) may provide higher electric field breakdown strengths and higher electron saturation velocities as compared to gallium arsenide (GaAs) and silicon (Si) based devices.

SUMMARY

Aspects and advantages of embodiments of the present disclosure will be set forth in part in the following description, or may be learned from the description, or may be learned through practice of the embodiments.

One example embodiment of the present disclosure is directed to a transistor device. The transistor device includes a channel layer. The transistor device includes a multilayer barrier structure on the channel layer. The multilayer barrier structure includes a first Group III-nitride layer and a second Group III-nitride layer on the first Group III-nitride layer and opposite to the channel layer. The first Group III-nitride layer has a thickness greater than a thickness of the second Group III-nitride layer. An aluminum concentration of the first Group III-nitride layer is at least two times greater than an aluminum concentration of the second Group III-nitride layer.

Another example embodiment of the present disclosure is directed to a transistor device. The transistor device includes a channel layer. The transistor device includes a multilayer barrier structure on the channel layer. The multilayer barrier structure includes a first Group III-nitride layer and a second Group III-nitride layer on the first Group III-nitride layer and opposite to the channel layer. The first Group III-nitride layer has a thickness at least four times greater than a thickness of the second Group III-nitride layer. An aluminum concentration of the first Group III-nitride layer is greater than an aluminum concentration of the second Group III-nitride layer.

Another example embodiment of the present disclosure is directed to a transistor device. The transistor device includes a channel layer. The transistor device includes a multilayer barrier structure on the channel layer. The multilayer barrier structure includes a first layer on the channel layer, a second layer on the first layer, and a third layer on the second layer. The first layer is an $Al_xGa_{1-x}N$ layer where $x \geq 0.5$. The second layer is $Al_yGa_{1-y}N$ layer where $0.2 \leq y < 1$. The third layer is an $Al_zGa_{1-z}N$ layer where $0 < z \leq 0.1$.

Another example embodiment of the present disclosure is directed to A transistor device. The transistor device includes a channel layer. The transistor device includes a multilayer Group III-nitride based barrier structure on the channel layer. The multilayer Group III-nitride based barrier structure includes a first layer and a second layer on the first layer. A thickness of the second layer or an aluminum concentration of the second layer is such that a current collapse of the transistor device after a stress condition is about 30% or less at a 0V gate voltage relative to operation of the transistor device prior to the stress condition, where the stress condition includes a 10-millisecond pulse of a 100V drain voltage and a −8V gate voltage.

Another example embodiment of the present disclosure is directed to a transistor device. The transistor device includes a channel layer. The transistor device includes a multilayer Group III-nitride based barrier structure on the channel layer. The multilayer Group III-nitride based barrier structure includes a first layer and a second layer on the first layer. A thickness of the second layer or an aluminum concentration of the second layer is such that a pinch-off voltage shift of the transistor device after a stress condition is about 0.4V or less at a 50V drain voltage relative to operation of the transistor device prior to the stress condition, where the stress condition comprises a 10-millisecond pulse of a 100V drain voltage and a −8V gate voltage.

These and other features, aspects and advantages of various embodiments will become better understood with reference to the following description and appended claims. The accompanying drawings, which are incorporated in and constitute a part of this specification, illustrate embodiments of the present disclosure and, together with the description, explain the related principles.

BRIEF DESCRIPTION OF THE DRAWINGS

Detailed discussion of embodiments directed to one of ordinary skill in the art are set forth in the specification, which refers to the appended figures, in which.

DETAILED DESCRIPTION

Figure 1:
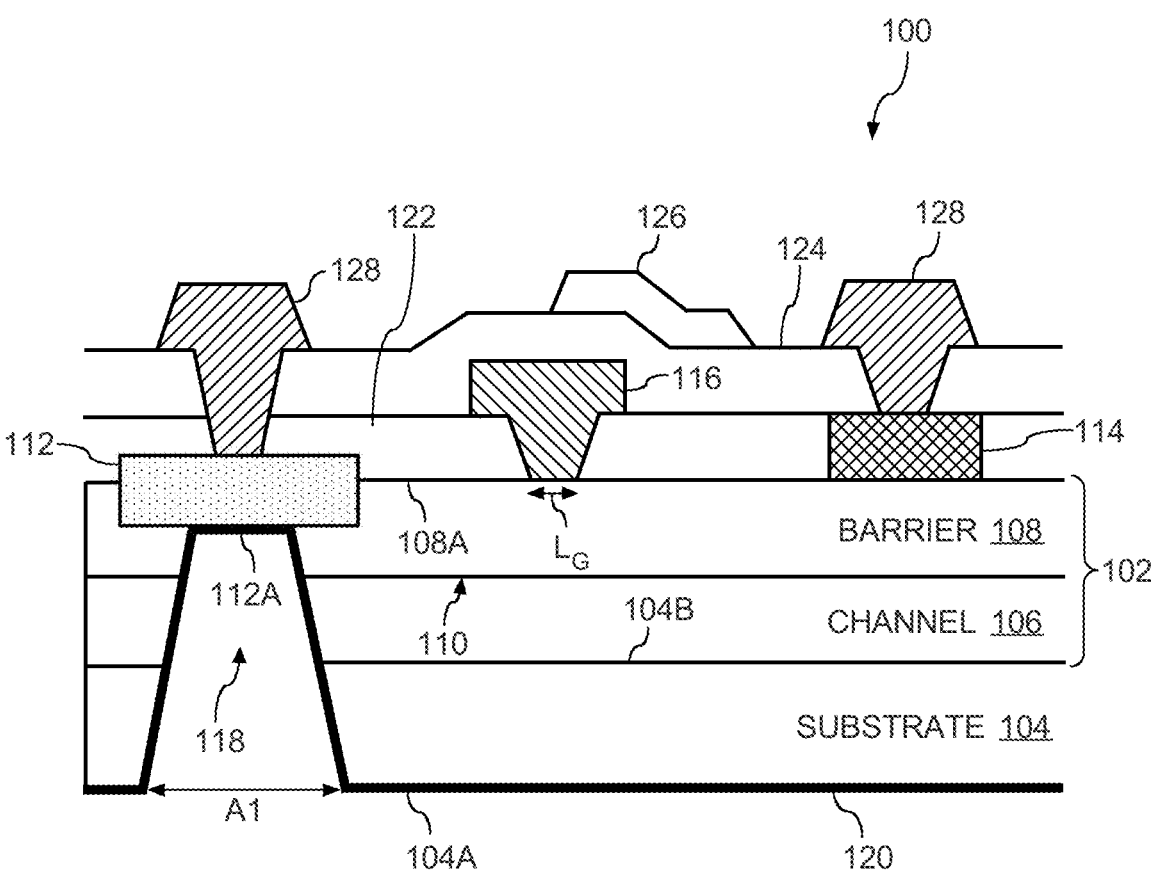
FIG. 1 depicts a cross-sectional view of an example transistor device according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Transistor devices, such as high electron mobility transistors (HEMTs), may be used in power electronics applications. HEMTs fabricated in Group III-nitride based material systems may have the potential to generate large amounts of radio frequency (RF) power because of the combination of material characteristics that includes high breakdown fields, wide bandgaps, large conduction band offset, and/or high saturated electron drift velocity. As such, Group III-Nitride based HEMTs may be promising candidates for high frequency and/or high-power RF applications, as well as for low frequency high power switching applications, both as discrete transistors or as coupled with other circuit elements, such as in monolithic microwave integrated circuit (MMIC) devices.

Field effect transistors such as HEMT devices may be classified into depletion mode and enhancement mode types, corresponding to whether the transistor is in an ON-state or an OFF-state at a gate-source voltage of zero. In enhancement mode devices, the devices are OFF at zero gate-source voltage, whereas in depletion mode devices, the device is ON at zero gate-source voltage. Often, high performance Group III nitride-based HEMT devices may be implemented as depletion mode (normally-on) devices, in that they are conductive at a gate-source bias of zero due to the polarization-induced charge at the interface of the barrier and channel layers of the device.

When an HEMT device is in an ON-state, a two-dimensional electron gas (2 DEG) is formed at the heterojunction of two semiconductor materials with different bandgap energies, where the smaller bandgap material has a higher electron affinity. The 2 DEG is an accumulation layer in the smaller bandgap material and can include a very high sheet electron concentration. Additionally, electrons that originate in the wider-bandgap semiconductor material transfer to the 2 DEG layer, allowing high electron mobility due to reduced ionized impurity scattering. This combination of high carrier concentration and high carrier mobility may give the HEMT device a very large transconductance (which may refer to the relationship between output current and input voltage) and may provide a strong performance advantage over MOS-FETs for high-frequency applications.

HEMT devices may include a channel layer of a Group III-nitride material (e.g., GaN). The HEMT device may include a barrier layer disposed on the channel layer. The barrier layer may include, for instance, a Group III-nitride material having a different bandgap than the channel layer. For instance, the barrier layer may include an AlGaN layer and/or an AlN layer. The arrangement of the barrier layer on the channel layer may lead to a very high electric field located under a gate region of the HEMT device. Under high stress conditions (e.g., high power switching conditions), the HEMT device may experience dispersion, such as a pinch-off voltage or current collapse. Pinch-off voltage can refer to a change in the gate voltage below which the HEMT device transitions to an OFF-state. Current collapse refers to a decrease in drain current of the HEMT device when the HEMT device is in a fully ON-state.

In high frequency and/or high power RF applications, the switching of transistor devices may place the transistor devices under high stress conditions. Transistor devices subject to higher dispersion under stress conditions may lead to degradation in performance. For instance, dispersion in transistor devices may lead to changes in gain over time and/or to lower power gain in RF amplifiers (e.g., power amplifiers and low noise amplifiers). The amplifiers may also lose linearization.

Example aspects of the present disclosure are directed to transistor devices (e.g., HEMT devices) that reduce dispersion under stress conditions. The transistor devices may have a multilayer barrier structure. The multilayer barrier structure may be disposed on a channel layer of the transistor device. The multilayer barrier structure may include a first Group III-nitride layer and a second Group III-nitride layer on the first Group III-nitride layer. The first Group III-nitride layer may have a thickness that is greater than a thickness of the second Group III-nitride layer. For instance, a ratio of the thickness of the first Group III-nitride layer to the thickness of the second Group III-nitride layer may be about 4:1 or greater. An aluminum concentration of the first Group III-nitride layer may be greater than an aluminum concentration of the second Group III-nitride layer. For instance, the aluminum concentration of the first Group III-nitride layer may be at least two times greater than the aluminum concentration of the second Group III-nitride layer, such as at least five times greater than an aluminum concentration of the second Group III-nitride layer, such as at least eight times greater than an aluminum concentration of the second Group III-nitride layer, such as in a range of at least two times greater to about ten times greater than an aluminum concentration of the second Group III-nitride layer.

Examples of the present disclosure provide technical effects and benefits. For instance, without being bound by any theory of operation, the present inventors have discovered that the multilayer barrier structure according to examples of the present disclosure may significantly reduce an electric field around a gate region of the transistor device. The reduction in electric field around the gate region reduces dispersion (e.g., current collapse and pinch-off voltage shift) of the transistor device under stress conditions, leading to more consistent operation of the transistor device as a discrete device or in combination with other circuit elements (e.g., as a MIMIC device) in various applications. The reduction in dispersion may allow the transistor device to be useful in many high stress applications, such as high power and/or high frequency RF applications.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "−" (as in N+, N−, P+, P−, N++, N−−, P++, P−−, or the like), to indicate a relatively larger ("+") or smaller ("−") concentration of majority carriers compared to another layer or region. However, such notation does not imply the existence of a particular concentration of majority or minority carriers in a layer or region.

Aspects of the present disclosure are discussed with reference to an HEMT transistor device for purposes of illustration and discussion. Those of ordinary skill in the art, using the disclosures provided herein, will appreciate that certain aspects of the present disclosure may be applicable to other transistor devices without deviating from the scope of the present disclosure.

In the drawings and specification, there have been disclosed typical embodiments and, although specific terms are employed, they are used in a generic and descriptive sense only and not for purposes of limitation of the scope set forth in the following claims.

With reference now to the Figures, example embodiments of the present disclosure will now be set forth.

FIG. 1 depicts a cross-sectional view of an example HEMT device 100 according to example embodiments of the present disclosure. FIG. 1 is intended to represent structures for identification and description and is not intended to represent the structures to physical scale. The HEMT device 100 may include a semiconductor structure 102. The semiconductor structure 102 may be a Group III nitride semiconductor structure.

As used herein, the term "Group III nitride" refers to those semiconducting compounds formed between nitrogen (N) and the elements in Group III of the periodic table, usually aluminum (Al), gallium (Ga), and/or indium (In). The term also refers to ternary and quaternary (or higher) compounds such as, for example, AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements.

The semiconductor structure 102 may be on a substrate 104. The substrate 104 may be a semiconductor material. For instance, the substrate 104 may be a silicon substrate, a silicon carbide (SiC) substrate, a sapphire substrate, or other suitable substrate. In some embodiments, the substrate 104 may be a semi-insulating SiC substrate that may be, for example, the 4H polytype of silicon carbide. Other SiC candidate polytypes may include the 3C, 6H, and 15R polytypes. The substrate may be a High Purity Semi-Insulating (HPSI) substrate, available from Wolfspeed, Inc. The term "semi-insulating" is used descriptively herein, rather than in an absolute sense.

In some embodiments, the SiC bulk crystal of the substrate 104 may have a resistivity equal to or higher than about $1\times10^5$ ohm-cm at room temperature. Example SiC substrates that may be used in some embodiments are manufactured by, for example, Wolfspeed, Inc., and methods for producing such substrates are described, for example, in U.S. Pat. No. Re. 34,861, U.S. Pat. Nos. 4,946,547, 5,200, 022, and 6,218,680, the disclosures of which are incorporated by reference herein. Although SiC may be used as a substrate material, embodiments of the present disclosure may utilize any suitable substrate, such as sapphire ($Al_2O_3$), aluminum nitride (AlN), aluminum gallium nitride (Al-GaN), gallium nitride (GaN), silicon (Si), GaAs, LGO, zinc oxide (ZnO), LAO, indium phosphide (InP), and the like. The substrate 104 may be a SiC wafer, and the HEMT device 100 may be formed, at least in part, via wafer-level processing, and the wafer may then be diced to provide a plurality of individual HEMT devices 100.

The substrate 104 may have a lower surface 104A and an upper surface 104B. In some embodiments, the substrate 104 of the HEMT device 100 may be a thinned substrate 104. In some embodiments, the thickness of the substrate 104 (e.g., in a vertical Z direction in FIG. 1) may be about 100 µm or less, such as about 75 µm or less, such as about 50 µm or less.

The HEMT device 100 may include a channel layer 106 on the upper surface 104B of the substrate 104 (or on the optional layers described further herein, such as an optional buffer layer or nucleation layer). The HEMT device 100 may include a barrier structure 108 on an upper surface of the channel layer 106. In some embodiments, the channel layer 106 and the barrier structure 108 may each be formed by epitaxial growth. Techniques for epitaxial growth of Group III nitrides have been described in, for example, U.S. Pat. Nos. 5,210,051, 5,393,993, and 5,523,589, the disclosures of which are incorporated by reference herein. The channel layer 106 may have a bandgap that is less than the bandgap of the barrier structure 108. The channel layer 106 may have a larger electron affinity than the barrier structure 108. The channel layer 106 and the barrier structure 108 may include Group III-nitride based materials.

In some embodiments, the channel layer 106 may be a Group III nitride, such as $Al_wGa_{1-w}N$, where $0 \le w < 1$, provided that the energy of the conduction band edge of the channel layer 106 is less than the energy of the conduction band edge of the barrier structure 108 at the interface between the channel layer 106 and barrier structure 108. In some embodiments, the aluminum mole fraction w is approximately 0, indicating that the channel layer 106 is GaN. The channel layer 106 may or may include other Group III-nitrides such as InGaN, AlInGaN or the like. The channel layer 106 may be undoped ("unintentionally doped") and may be grown to a thickness in the range of about 0.5 µm to about 5 such as about 2 The channel layer 106 may be a multi-layer structure, such as a superlattice or combinations of GaN, AlGaN or the like. The channel layer 106 may be under compressive strain in some embodiments.

The barrier structure 108 may be a multilayer barrier structure 108. Details concerning example barrier structures 108 will be discussed with reference to FIGS. 2-5. The channel layer 106 and/or the barrier layer 108 may be deposited, for example, by metal-organic chemical vapor deposition (MOCVD), molecular beam epitaxy (MBE), or hydride vapor phase epitaxy (HYPE). A 2 DEG 110 may be induced in the channel layer 106 at an interface between the channel layer 106 and the barrier structure 108. The 2 DEG 110 is highly conductive and allows conduction between the source and drain regions of the HEMT device 100.

While the HEMT device 100 is shown with a substrate 104, channel layer 106 and barrier layer 108 for purposes of illustration, the HEMT device 100 may include additional layers/structures/elements. For instance, the HEMT device 100 may include a buffer layer and/or nucleation layer(s) between substrate 104 and the channel layer 106. For example, an AlN buffer layer may be on the upper surface 104B of the substrate 104 to provide an appropriate crystal structure transition between a SiC substrate 104 and the channel layer 106. The optional buffer/nucleation/transition layers may be deposited by MOCVD, MBE, and/or HVPE.

The HEMT device 100 may include a cap layer on the barrier structure 108. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, 7,709,269, 7,709,859 and 10,971,612, the disclosures of which are incorporated by reference herein. Additionally, strain balancing transition layer(s) may also and/or alternatively be provided as described, for example, in U.S. Pat. No. 7,030,428, the disclosure of which is incorporated by reference herein.

The HEMT device 100 may include a source contact 112 on an upper surface 108A of the barrier structure 108 or otherwise contacting the barrier structure 108. The HEMT device 100 may include a drain contact 114 on the upper surface 108A of the barrier structure 108 or otherwise contacting the barrier structure 108. The source contact 112 and the drain contact 114 may be laterally spaced apart from each other. In some embodiments, the source contact 112 and the drain contact 114 may include a metal that may form an ohmic contact to a Group III-nitride based semiconductor material. Suitable metals may include refractory metals, such as titanium (Ti), tungsten (W), titanium tungsten (TiW), silicon (Si), titanium tungsten nitride (TiWN), tungsten silicide (WSi), rhenium (Re), niobium (Nb), Ni, gold (Au), aluminum (Al), tantalum (Ta), molybdenum (Mo), NiSix, titanium silicide (TiSi), titanium nitride (TiN), tungsten silicon nitride (WSiN), platinum (Pt) and the like. In some embodiments, the source contact 112 may be an ohmic source contact 112. The drain contact 114 may be an ohmic drain contact 114. Thus, the source contact 112 and/or the drain contact 114 may include an ohmic contact portion in direct contact with the barrier structure 108. In some embodiments, the source contact 112 and/or the drain contact 114 may include a plurality of layers to form an ohmic contact that may be provided as described, for example, in U.S. Pat. Nos. 8,563,372 and 9,214,352, the disclosures of which are incorporated by reference herein.

The HEMT device 100 may include a gate contact 116 on the upper surface 108A of the barrier structure 108 or otherwise contacting the barrier structure 108 (e.g., recessed into the barrier structure 108). The gate contact 116 may have a gate length LG. The gate length LG may be the length of the gate contact 116 at the portion of the gate contact 116 that is on the semiconductor structure 102 as illustrated in FIG. 1. In some embodiments, the gate length LG may be in the range of about 100 nm to about 200 nm, such as about 150 nm. In some embodiments, the gate length LG may be about 100 nm or less, such as about 90 nm or less, such as about 60 nm or less. In some embodiments, the gate length LG may be in a range of about 40 nm to about 90 nm.

The material of the gate contact 116 may be chosen based on the composition of the barrier structure 108, and may, in some embodiments, be a Schottky contact. Materials capable of making a Schottky contact to a Group III-nitride based semiconductor material may be used, such as, for example, nickel (Ni), platinum (Pt), nickel silicide (NiSix), copper (Cu), palladium (Pd), chromium (Cr), tungsten (W) and/or tungsten silicon nitride (WSiN).

The source contact 112 may be coupled to a reference signal such as, for example, a ground voltage or other reference signal. The coupling to the reference signal may be provided by a via 118 that extends from a lower surface 104A of the substrate 104, through the substrate 104 and the channel layer 106 to the upper surface 108A of the barrier structure 108. The via 118 may expose a bottom surface of the ohmic portion 112A of the source contact 112. A back metal layer 120 may be on the lower surface 104A of the substrate 104 and on side walls of the via 118. The back metal layer 120 may directly contact the ohmic portion 112A of the source contact 112. In some embodiments a contact area between the back metal layer 120 and the bottom surface of the ohmic portion 112A of the source contact 112 may be fifty percent or more of an area of the bottom surface of the ohmic portion 112A of the source contact 112. Thus, the back metal layer 120, and a signal coupled thereto, may be electrically connected to the source contact 112.

In some embodiments, the via 118 may have an oval or circular cross-section when viewed in a plan view. However, the present disclosure is not limited thereto. In some embodiments, a cross-section of the via 118 may be a polygon or other shape, as will be understood by one of ordinary skill in the art using the disclosures provided herein. In some embodiments, dimensions of the via (e.g., a length and/or a width) may be such that a largest cross-sectional area A1 of the via 118 is about 1000 $\mu m^2$ or less. The cross-sectional area A1 may be taken in a direction that is parallel to the lower surface 104A of the substrate 104 (e.g., the X-Y plane of FIG. 1). In some embodiments, the largest cross-sectional area A1 of the via 118 may be that portion of the via 118 that is adjacent the lower surface 104A of the substrate 104 (e.g., the opening of the via 118). For example, in some embodiments, a greatest width (e.g., in the X direction in FIG. 1) may be about 16 $\mu m$ and a greatest length (e.g., in the Y direction in FIG. 1) may be about 40 $\mu m$, though the present disclosure is not limited thereto. In some embodiments, sidewalls of the via 118 may be inclined and/or slanted with respect to the lower surface 104A of the substrate 104. In some embodiments, the sidewalls of the via 118 may be approximately perpendicular to the lower surface 104A of the substrate 104.

Depending on the embodiment, the drain contact 114 may be formed on, in and/or through the barrier structure 108, and there can be ion implantation into the materials around the drain contact 114 to reduce resistivity and provide improved ohmic contact to the semiconductor material. In yet other embodiments, there is no source via 118, and the source contact 112 is formed on, in and/or through the barrier structure 108, and there can be ion implantation in the materials around the source contact 112 to reduce resistivity and provide improved ohmic contact to the semiconductor material. Where there is no source via 118, the electrical connections to the source contact 112 can be made on the same side as the gate contact 116 and the drain contact 114. In some examples, the connections to the source contact 112, drain contact 114, and/or gate contact 116 can be made from the top and/or the bottom to provide for flip chip configuration of the HEMT device 100. In some examples, thermal paths may be provided from the top and/or bottom to provide for flip chip configuration of the HEMT device 100.

The HEMT device 100 may include a first insulating layer 122. The first insulating layer 122 may directly contact the upper surface of the semiconductor structure 102 (e.g., contact the upper surface 108A of the barrier structure 108). The HEMT device 100 may include a second insulating layer 124. The second insulating layer 124 may be on the first insulating layer 122. It will also be appreciated that more than two insulating layers may be included in some embodiments. The first insulating layer 122 and/or the second insulating layer 124 may serve as passivation layers for the HEMT device 100. The first insulating layer 122 and/or the second insulating layer 124 may be dielectric layers. Different dielectric materials may be used such as a SiN, SiO2, Si, Ge, MgOx, MgNx, ZnO, SiNx, SiOx, alloys or layer sequences thereof, or epitaxial materials.

The source contact 112, the drain contact 114, and the gate contact 116 may be in the first insulating layer 122. In some embodiments, at least a portion of the gate contact 116 may be on the first insulating layer 122. In some embodiments, the gate contact 116 may be a T-shaped gate and/or a gamma gate, the formation of which is discussed by way of example in U.S. Pat. Nos. 8,049,252, 7,045,404, and 8,120,064, the disclosures of which are incorporated by reference herein. The second insulating layer 124 may be on the first insulating layer 122 and on portions of the source contact 112, drain contact 114, and gate contact 116. The protrusions from the gate can also be referred to as a field plate integrated with the gate.

Field plates 126 may be on the second insulating layer 124 as illustrated in FIG. 1, or on another insulating layer depending on the number of insulating layers included in the HEMT device. At least a portion of a field plate 126 may be on the gate contact 116. At least a portion of the field plate 126 may be on a portion of the second insulating layer 124 that is between the gate contact 116 and the drain contact 114. The field plate 126 may reduce the peak electric field in the HEMT device 100, which may result in increased breakdown voltage and reduced charge trapping. The reduction of the electric field can also yield other benefits such as reduced leakage currents and enhanced reliability. Field plates and techniques for forming field plates are discussed, by way of example, in U.S. Pat. No. 8,120,064, the disclosure of which is incorporated by reference herein.

Metal contacts 128 may be disposed in the second insulating layer 124 as illustrated in FIG. 1, or on another insulating layer depending on the number of insulating layers included in the HEMT device. The metal contacts 128 may provide interconnection between the source contact 112, drain contact 114, gate contact 116, and other parts of the HEMT device 100. Respective ones of the metal contacts 128 may directly contact respective ones of the drain contact 114 and/or source contact 112. The metal contacts 128 may include metal or other highly conductive material, including, for example, copper, cobalt, gold, and/or a composite metal.

A HEMT transistor may be formed by the active region between the source contact 112 and the drain contact 114 under the control of a gate contact 116 between the source contact 112 and the drain contact 114. FIG. 1 depicts a cross-sectional view of one unit of an HEMT device 100 for purposes of illustration. The HEMT device 100 may be formed adjacent to additional HEMT device units and may share, for instance, a source contact 112 with adjacent HEMT device units.

Figure 2:
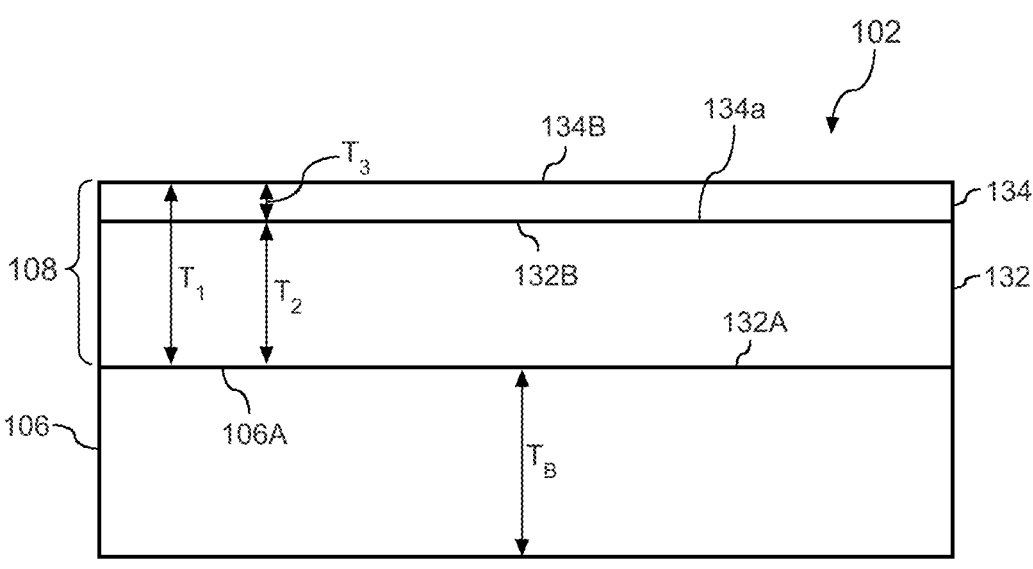
FIG. 2 depicts a multilayer barrier structure according to example embodiments of the present disclosure.

FIG. 2 depicts an example semiconductor structure 102 according to example aspects of the present disclosure that may be used, for instance, in the HEMT device 100 of FIG. 1. FIG. 2 is intended to represent structures for identification and description and is not intended to represent the structures to physical scale. The semiconductor structure 102 includes a multilayer barrier structure 108 on a channel layer 106. The multilayer barrier structure 108 includes a first Group III-nitride layer 132 having a first surface 132A disposed on a surface 106A of the channel layer 106. The multilayer barrier structure 108 includes a second Group III-nitride layer 134 on the first Group III-nitride layer 132 such that a first surface 134A of the second Group III-nitride layer 134 is disposed on a second surface 132B of the first Group III-nitride layer 132 opposite the channel layer 106. Multilayer barrier structures 108 that include the first group III-nitride layer 132 and the second Group III-nitride layer 134 may also be referred to as multilayer group III-nitride based barrier structures.

The multilayer barrier structure 108 may have a thickness $T_1$. The thickness $T_1$ may be in a range, for instance, of about 150 Angstroms to about 350 Angstroms, such as in a range of about 200 Angstroms to about 350 Angstroms, such as in a range of about 200 Angstroms to about 300 Angstroms, such as in a range of about 200 Angstroms to about 250 Angstroms. In some embodiments, the thickness $T_1$ may be about 310 Angstroms. In some embodiments, the thickness $T_1$ may be about 280 Angstroms. In some embodiments, the thickness $T_1$ may be about 250 Angstroms. A ratio of the thickness $T_1$ of the multilayer barrier structure 108 to a thickness TB of the channel layer 106 may be, for instance, in a range of about 1:12 to about 1:250, such as in a range of about 1:50 to about 1:90. The multilayer barrier structure 108 may be thick enough and may have a high enough aluminum (Al) composition and doping to induce a significant carrier concentration at the interface between the channel layer 106 and the multilayer barrier structure 108 through polarization effects.

In some embodiments, the multilayer barrier structure 108 may have a thickness $T_1$ of about 150 Angstroms or less. For instance, in higher frequency applications, a gate length LG of the gate contact 116 for the HEMT device 100 may be about 100 nm or less, such as about 90 nm or less, such as about 60 nm or less, or in a range of about 40 nm to about 90 nm. In these applications, the thickness $T_1$ of the multilayer barrier structure 108 may be reduced such that a ratio of the gate length LG of the gate contact 116 to the thickness $T_1$ of the multilayer barrier structure 108 is in a range from 8:1 to 16:1. For instance, the multilayer barrier structure 108 may have a thickness $T_1$ of about 50 Angstroms to about 120 Angstroms.

The first Group III-nitride layer 132 may be a Group III-nitride, such as $Al_yGa_{1-y}N$, where y is the aluminum mole fraction in the first Group III-nitride layer 132. The energy of the conduction band edge of the first Group III-nitride layer 132 is greater than the energy of the conduction band edge of the channel layer 106 at the interface between the channel layer 106 and multilayer barrier structure 108. In some embodiments, the aluminum mole fraction y is such that $0.2 \le y < 1$ (e.g., the aluminum mole fraction is in a range of about 20% to about 100%), indicating that the first Group III-nitride layer 132 is an AlGaN layer. However, the first Group III-nitride layer 132 may include other Group III elements (e.g., In) without deviating from the scope of the present disclosure.

The second Group III-nitride layer 134 may be a Group III-nitride, such as $Al_zGa_{1-z}N$, where z is the aluminum mole fraction in the second Group III-nitride layer 134. The aluminum concentration of the second Group III-nitride layer 134 may be less than an aluminum concentration of the first Group III-nitride layer 132. For instance, in some embodiments, the aluminum concentration of the first Group III-nitride layer 132 may be at least about two times greater than the aluminum concentration of the second Group III-nitride layer 134, such as at least five times greater than the aluminum concentration of the second Group III-nitride layer 134, such as at least eight times greater than an aluminum concentration of the second Group III-nitride layer 134, such as in a range of at least two times greater to about ten times greater than an aluminum concentration of the second Group III-nitride layer 134. In some embodiments, the aluminum mole fraction z is such that $0 < z \le 0.1$ (e.g., the aluminum mole fraction is in a range of about 1% to about 10%), indicating that the second Group III-nitride layer 134 is an AlGaN layer. However, the second Group III-nitride layer 134 may include other Group III elements (e.g., In) without deviating from the scope of the present disclosure.

In some embodiments, the second Group III-nitride layer 134 may have a graded concentration of aluminum that increases from the second surface 134B to the first surface 134A of the second Group III-nitride layer 134. For instance, the second Group III-nitride layer 134 may have a graded concentration of aluminum such that the second Group III-nitride layer 134 has a higher aluminum concentration at the first surface 134A at an interface between the first Group III-nitride layer 132 and the second Group III-nitride layer 134 relative to the second surface 134B of the second Group III-nitride layer 134 opposite the first Group III-nitride layer 132. The graded concentration of aluminum can increase from the second surface 134B to the first surface 134A at a consistent change in concentration, at a varying change in concentration, or combinations thereof. For instance, the graded concentration of aluminum can increase from an aluminum mole fraction of about 0% at the second surface 134B to an aluminum mole fraction of about 10% at the first surface 134A.

In some embodiments, there may be a difference in aluminum concentration between the first Group III-nitride layer 132 and the second Group III-nitride layer 134 at an interface between the first Group III-nitride layer 132 and the second Group III-nitride layer 134. For instance, in some embodiments, the aluminum concentration of the first Group III-nitride layer 132 may be at least two times greater than the aluminum concentration of the second Group III-nitride layer 134 at the interface between the first Group III-nitride layer 132 and the second Group III-nitride layer 134, such as at least five times greater than the aluminum concentration of the second Group III-nitride layer 134 at the interface between the first Group III-nitride layer 132 and the second Group III-nitride layer 134, such as at least eight times greater than an aluminum concentration of the second Group III-nitride layer 134, such as in a range of at least two times greater to about ten times greater than an aluminum concentration of the second Group III-nitride layer 134.

The first Group III-nitride layer 132 may have a thickness $T_2$ and the second Group III-nitride layer 134 may have a thickness $T_3$. In some embodiments, a ratio of the thickness $T_2$ of the first Group III-nitride layer 132 to the thickness $T_3$ of the second Group III-nitride layer 134 may be in a range of about 3:1 or greater, such as about 4:1 or greater, such as in a range of about 3:1 to about 15:1. In some embodiments, the thickness $T_2$ of the first group III-nitride layer 132 may be about four times greater than the thickness $T_3$ of the second group III-nitride layer 134. In some embodiments, the thickness $T_2$ may be in a range of about 200 Angstroms to about 250 Angstroms, such as about 230 Angstroms. The thickness $T_3$ of the second Group III-nitride layer 134 may be about 50 Angstroms or less, such as about 30 Angstroms or less, such as about 30 Angstroms.

In embodiments having a gate length LG of 100 nm or less, the total thickness $T_1$ of the multilayer barrier structure 108 may be in the range of about 50 Angstroms to about 120 Angstroms. In these embodiments, the thickness $T_2$ of the first Group III-nitride layer 132 and the thickness $T_3$ of the second Group III-nitride layer 134 may be correspondingly reduced to preserve a ratio of the thickness $T_2$ of the first Group III-nitride layer 132 to the thickness $T_3$ second Group III-nitride layer 134 to be in a range of about 3:1 or greater, such as about 4:1 or greater, such as in a range of about 3:1 to about 15:1.

Figure 3:
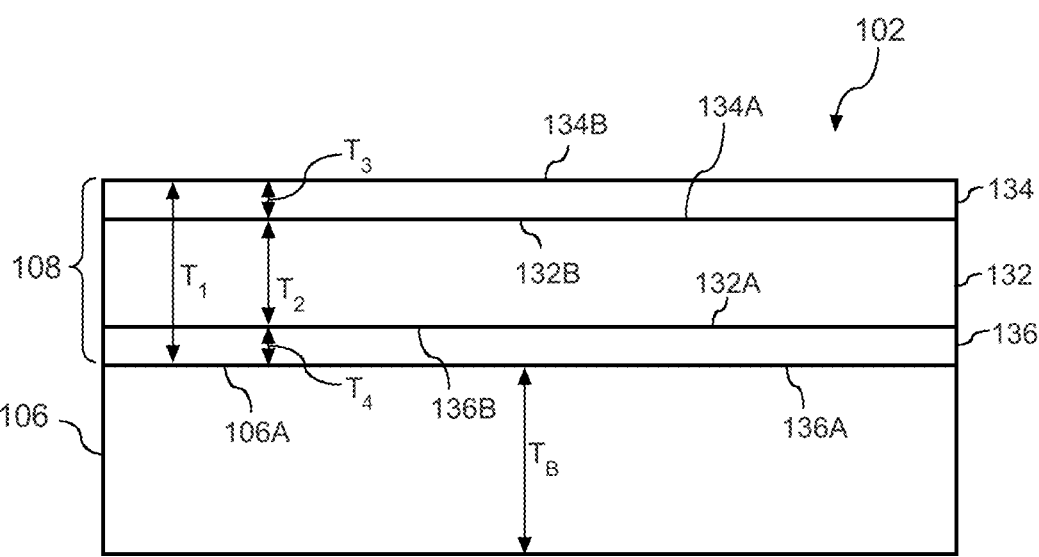
FIG. 3 depicts a multilayer barrier structure according to example embodiments of the present disclosure.

FIG. 3 depicts another example semiconductor structure 102 that may be used, for instance, in the HEMT device 100 of FIG. 1 according to example aspects of the present disclosure. FIG. 3 is intended to represent structures for identification and description and is not intended to represent the structures to physical scale. The semiconductor structure 102 includes a multilayer barrier structure 108 on a channel layer 106. The multilayer barrier structure 108 includes a first Group III-nitride layer 132 and a second Group III-nitride layer 134 having a similar configuration as in FIG. 2.

The multilayer barrier structure 108 additionally includes a spacer layer or interface layer 136 (referred to herein as an "interface layer") (e.g., a third layer, such as a third Group III-nitride layer) disposed between the channel layer 106 and the first Group III-nitride layer 132. The interface layer 136 has a first surface 136A disposed on a surface 106A of the channel layer 106. The first Group III-nitride layer 132 is disposed on the interface layer 136 such that a first surface 132A of the first Group III-nitride layer 132 is on a second surface 136B of the interface layer 136 opposite the channel layer 106.

The interface layer 136 may be a Group III-nitride, such as $Al_xGa_{1-x}N$, where x is the aluminum mole fraction in the interface layer 136. In some embodiments, the aluminum mole fraction x is such that x≥0.5 (e.g., the aluminum mole fraction is greater than 50%), indicating that the interface layer 136 is an AlGaN layer. In some embodiments, the aluminum mole fraction x is such that x≥0.75 (e.g., the aluminum mole fraction is greater than 75%), indicating that the interface layer 136 is an AlGaN layer. In some embodiments, the aluminum mole fraction is 1 (e.g., the aluminum mole fraction is 100%), indicating that the interface layer 136 is an AlN layer. However, the interface layer 136 may include other Group III elements (e.g., In) without deviating from the scope of the present disclosure.

The interface layer 136 may have a thickness $T_4$. The thickness $T_4$ may be about 50 Angstroms or less, such as about 30 Angstroms or less, such as in a range of about 3 Angstroms to about 50 Angstroms, such as in a range of about 3 Angstroms to about 30 Angstroms.

The multilayer barrier structure 108 may have a thickness $T_1$ that includes the thickness $T_2$ of the first Group III-nitride layer 132, the thickness $T_3$ of the second Group III-nitride layer 134, and the thickness $T_4$ of the interface layer 136. The thickness $T_1$ may be in a range, for instance, of about 150 Angstroms to about 350 Angstroms, such as in a range of about 200 Angstroms to about 350 Angstroms, such as in a range of about 200 Angstroms to about 300 Angstroms, such as in a range of about 200 Angstroms to about 250 Angstroms. In some embodiments, the thickness $T_1$ may be about 310 Angstroms. In some embodiments, the thickness $T_1$ may be about 280 Angstroms. In some embodiments, the thickness $T_1$ may be about 250 Angstroms. A ratio of the thickness $T_1$ of the multilayer barrier structure 108 to a thickness TB of the channel layer 106 may be, for instance, in a range of about 1:12 to about 1:250, such as in a range of about 1:50 to about 1:90. The multilayer barrier structure 108 may be thick enough and may have a high enough aluminum (Al) composition and doping to induce a significant carrier concentration at the interface between the channel layer 106 and the multilayer barrier structure 108 through polarization effects.

In some embodiments, the multilayer barrier structure 108 may have a thickness $T_1$ of about 150 Angstroms or less. For instance, in higher frequency applications, a gate length LG of the gate contact 116 for the HEMT device 100 may be about 100 nm or less, such as about 90 nm or less, such as about 60 nm or less, such as in a range of about 40 nm to about 90 nm. In these applications, the thickness $T_1$ of the multilayer barrier structure 108 may be reduced such that a ratio of the gate length LG of the gate contact to the thickness $T_1$ of the multilayer barrier structure 108 is in a range from 8:1 to 16:1. For instance, the multilayer barrier structure 108 may have a thickness $T_1$ of about 50 Angstroms to about 120 Angstroms.

In embodiments having a gate length LG of 100 nm or less, the total thickness $T_1$ of the multilayer barrier structure 108 may be in the range of about 50 Angstroms to about 120 Angstroms. In these embodiments, the thickness $T_2$ of the first Group III-nitride layer 132 and the thickness $T_3$ of the second Group III-nitride layer 134 may be correspondingly reduced to preserve a ratio of the thickness $T_2$ of the first Group III-nitride layer 132 to the thickness $T_3$ second Group III-nitride layer 134 to be in a range of about 3:1 or greater, such as about 4:1 or greater, such as in a range of about 3:1 to about 15:1.

Figure 4:
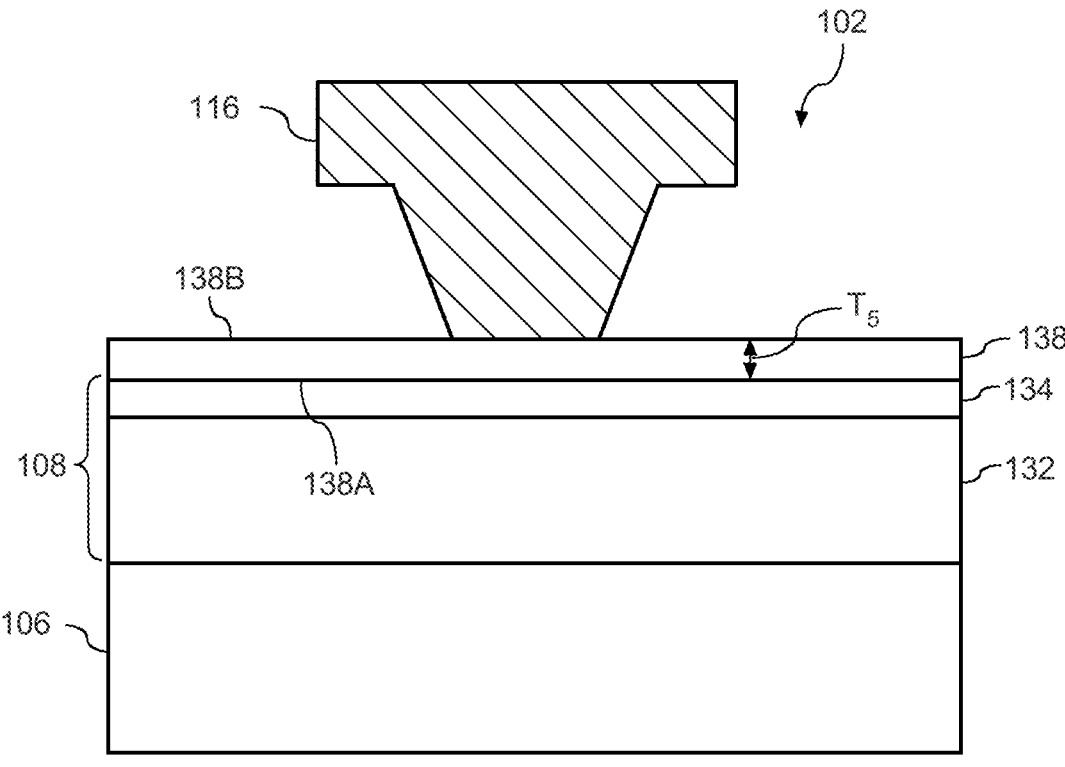
FIG. 4 depicts a multilayer barrier structure according to example embodiments of the present disclosure.

FIG. 4 depicts another example semiconductor structure 102 that may be used, for instance, in the HEMT device 100 of FIG. 1 according to example embodiments of the present disclosure. FIG. 4 is intended to represent structures for identification and description and is not intended to represent the structures to physical scale. The semiconductor structure 102 includes a multilayer barrier structure 108 on a channel layer 106. The multilayer barrier structure 108 includes a first Group III-nitride layer 132 and a second Group III-nitride layer 134 having a similar configuration as in FIG. 2.

The semiconductor structure 102 additionally includes a cap layer 138 if disposed between the multilayer barrier structure 108 and the gate contact 116. The cap layer 138 may include a single layer or may include multiple layers. The cap layer 138 may have a thickness, for instance, in a range of about 20 Angstroms to about 50 Angstroms. The cap layer 138 may be a Group III-nitride, such as $Al_cGa_{1-c}N$, where c is an aluminum mole fraction of the cap layer 138. In some embodiments, the aluminum mole fraction c is such that 0≤c≤0.15. In some embodiments, the cap layer 138 is a GaN layer. In some embodiments, the cap layer 138 is an AlGaN layer. In some embodiments, the cap layer 138 is an AlN layer. The cap layer 138 may include other Group III elements (e.g., In) without deviating from the scope of the present disclosure.

In some embodiments, the cap layer 138 may have a graded concentration of aluminum or varying concentration of aluminum. For instance, the cap layer 138 may have a different concentration of aluminum at a first surface 138A of the cap layer 138 at an interface between the cap layer 138 and the multilayer barrier structure 108 relative to a second surface 138B of the cap layer 138 opposite the multilayer barrier structure 108.

FIG. 4 depicts the gate contact 116 disposed on the cap layer 138. The gate contact 116 may be recessed into the cap layer 138 without deviating from the scope of the present disclosure. The cap layer 138 may be deposited, for example, by MOCVD, MBE, or HVPE.

Figure 5:
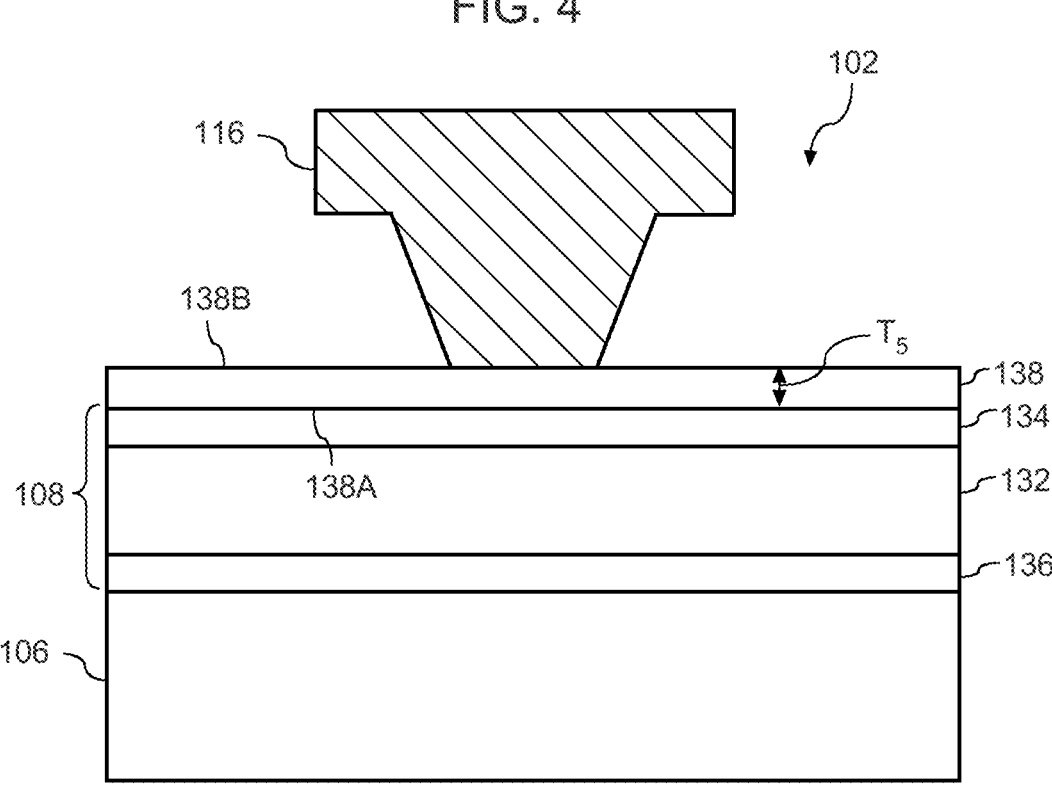
FIG. 5 depicts a multilayer barrier structure according to example embodiments of the present disclosure.

FIG. 5 depicts another example semiconductor structure 102 that may be used, for instance, in the HEMT device 100 of FIG. 1 according to example embodiments of the present disclosure. FIG. 5 is intended to represent structures for identification and description and is not intended to represent the structures to physical scale. The semiconductor structure 102 includes a multilayer barrier structure 108 on a channel layer 106. The multilayer barrier structure 108 includes a first Group III-nitride layer 132, a second Group III-nitride layer 134, and an interface layer 136 having a similar configuration as in FIG. 3.

In FIG. 5, the semiconductor structure 102 additionally includes a cap layer 138 disposed between the multilayer barrier structure 108 and the gate contact 116. The cap layer 138 may include a single layer or may include multiple layers. The cap layer 138 may have a thickness $T_5$, for instance, in a range of about 20 Angstroms to about 50 Angstroms. The cap layer 138 may be a Group III-nitride, such as $Al_cGa_{1-c}N$, where c is an aluminum mole fraction of the cap layer 138. In some embodiments, the aluminum mole fraction c is such that $0 \le c \le 0.15$. In some embodiments, the cap layer 138 is a GaN layer. In some embodiments, the cap layer 138 is an AlGaN layer. In some embodiments, the cap layer 138 is an AlN layer. The cap layer 138 may include other Group III elements (e.g., In) without deviating from the scope of the present disclosure.

In some embodiments, the cap layer 138 may have a graded concentration of aluminum or varying concentration of aluminum. For instance, the cap layer 138 may have a different concentration of aluminum at a first surface 138A of the cap layer 138 at an interface between the cap layer 138 and the multilayer barrier structure 108 relative to a second surface 138B of the cap layer 138 opposite the multilayer barrier structure 108.

FIG. 5 depicts the gate contact 116 disposed on the cap layer 138. The gate contact 116 may be recessed into the cap layer 138 without deviating from the scope of the present disclosure. The cap layer 138 may be deposited, for example, by MOCVD, MBE, or HVPE.

Transistor devices incorporating a multilayer barrier structure 108 according to the examples of FIGS. 2-5 may demonstrate less dispersion under stress conditions. In this regard, transistor devices incorporating multilayer barrier structures 108 according to example embodiments of the present disclosure may provide increased performance in applications involving high stress conditions, such as high frequency and/or high-power RF switching applications.

Figure 6:
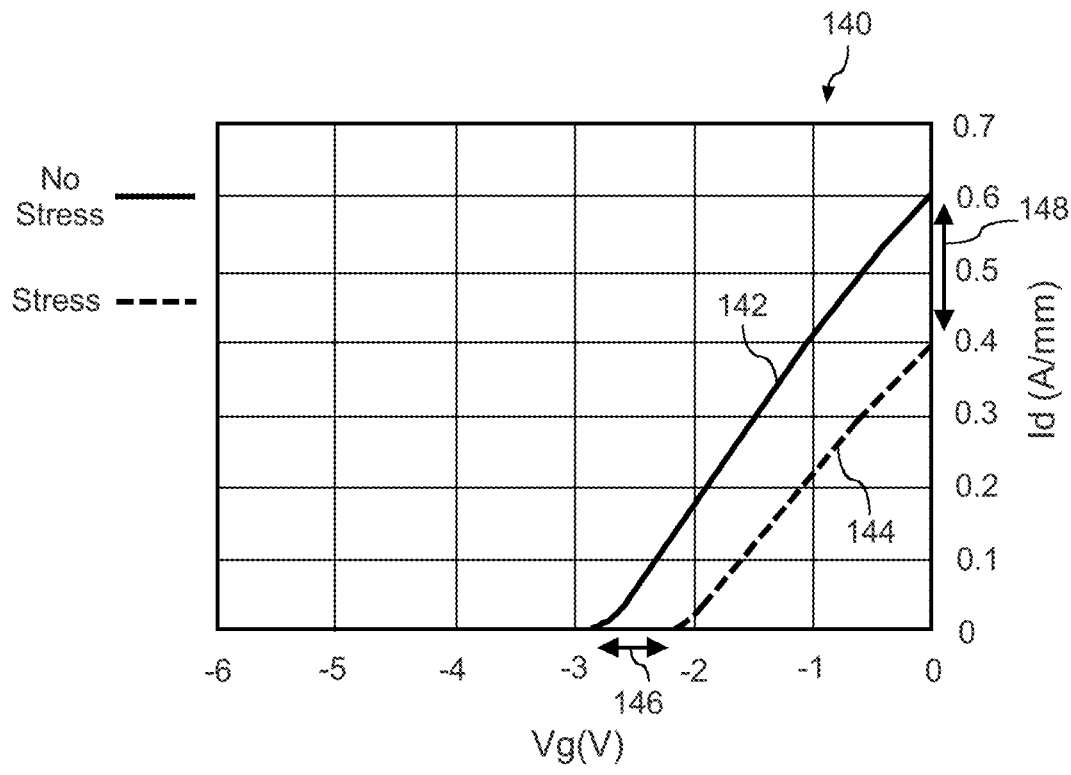
FIG. 6 depicts a graphical representation of dispersion of a transistor device under a stress condition.
Figure 7:
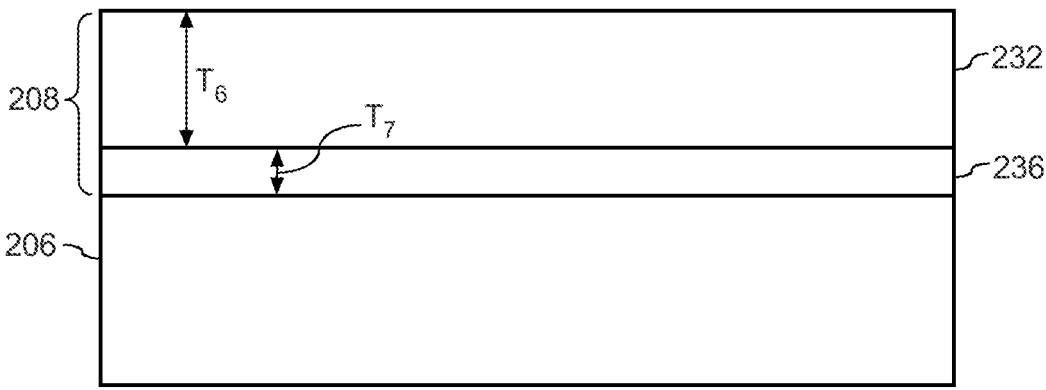
FIG. 7 depicts a conventional barrier structure for a transistor device that exhibits the dispersion of FIG. 6.

More particularly, FIG. 6 depicts a plot 140 of example dispersion of a conventional HEMT device having a conventional barrier structure after being subjected to a stress condition. FIG. 7 depicts an example conventional barrier structure 208 associated with the plot 140 of FIG. 6. The barrier structure 208 of FIG. 7 is on a channel layer 206. The barrier structure 208 has an AlGaN layer 232 disposed on an AlN interface layer 236. The AlGaN layer 232 has a thickness $T_6$ of about 250 Angstroms and an aluminum mole fraction of about 22%. The AlN interface layer 236 has a thickness $T_7$ of about 50 Angstroms or less.

FIG. 6 plots gate voltage Vg (V) along the horizontal axis and drain current density Id (A/mm) along the vertical axis. Curve 142 is associated with a no stress condition. Curve 142 is obtained by applying a 50V drain voltage to the drain contact of the HEMT device and sweeping the gate voltage applied to the gate contact of the HEMT device from 0V to −6V. Curve 142 plots drain current density at each gate voltage.

Curve 144 is associated with a stress condition. The stress condition includes applying a 10-millisecond pulse of a 100V drain voltage to the drain contact of the HEMT device and a −8V gate voltage to the gate contact of the HEMT device. After the stress condition, curve 144 is obtained by applying a 50V drain voltage to the drain contact of the HEMT and sweeping the gate voltage applied to the gate contact of the HEMT device from 0V to −6V. Curve 144 plots drain current density at each gate voltage.

As indicated by the differences in curve 142 and curve 144, the HEMT device having the barrier structure 208 of FIG. 7 experiences dispersion after the stress condition. More particularly, the HEMT device experiences a pinch off voltage shift 146 of about 0.8V. The HEMT device experiences a current collapse 148 of about 34% (e.g., reduction in drain current density about 0.6 A/mm to a drain current density of about 0.4 A/mm).

Figure 8:
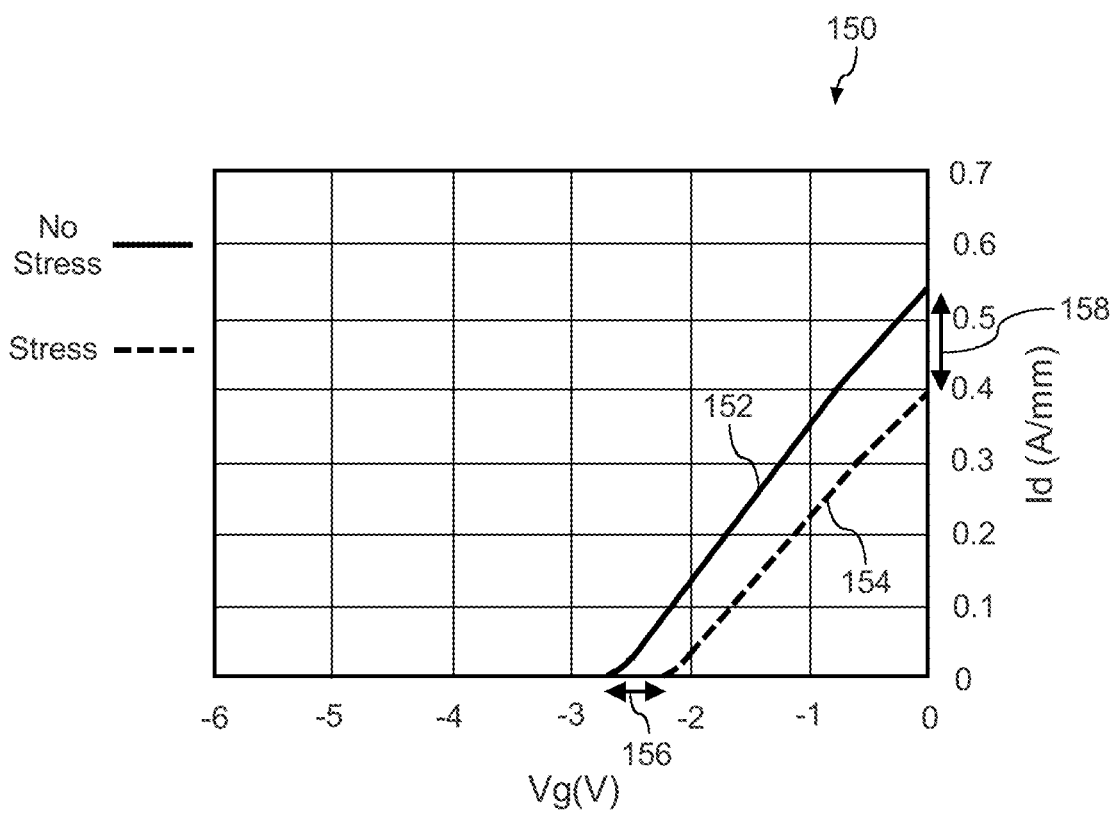
FIG. 8 depicts a graphical representation of dispersion of a transistor device according to example embodiments of the present disclosure.

FIG. 8 depicts a plot 150 of example dispersion of an HEMT device according to example embodiments of the present disclosure. The plot 150 can be associated with an HEMT device having the barrier structure 108 depicted in FIG. 3. More particularly, the barrier structure 108 may have a first Group III-nitride layer 132, a second Group III-nitride layer 134, and an interface layer 136. The first Group III-nitride layer 132 can have a thickness $T_2$ of about 220 Angstroms and an aluminum mole fraction of about 25%. The second Group III-nitride layer 134 can have a thickness $T_3$ of about 30 Angstroms and an aluminum mole fraction of about 5%. The interface layer 136 can be an AlN layer with a thickness $T_4$ of about 50 Angstroms or less.

FIG. 8 plots gate voltage Vg (V) along the horizontal axis and drain current density Id (A/mm) along the vertical axis. Curve 152 is associated with a no stress condition. Curve 152 is obtained by applying a 50V drain voltage to the drain contact of the HEMT device and sweeping the gate voltage applied to the gate contact of the HEMT device from 0V to −6V. Curve 152 plots drain current density at each gate voltage.

Curve 154 is associated with a stress condition. The stress condition includes applying a 10-millisecond pulse of a 100V drain voltage to the drain contact of the HEMT device and a −8V gate voltage to the gate contact of the HEMT device. After applying the stress condition, curve 154 is obtained by applying a 50V drain voltage to the drain contact of the HEMT and sweeping the gate voltage applied to the gate contact of the HEMT device from 0V to −6V. Curve 154 plots drain current density at each gate voltage.

As indicated by the differences in curve 152 and curve 154, the HEMT device according to example aspects of the present disclosure experiences dispersion after the stress condition. More particularly, the HEMT device experiences a pinch off voltage shift 156 after a stress condition of about 0.4V or less at a 50V drain voltage relative to operation of the HEMT device prior to the stress condition. The HEMT device experiences a current collapse 158 after a stress condition of about 30% or less (e.g., 26%) at a 0V gate voltage relative to operation of the HEMT device prior to the stress condition.

As demonstrated by FIG. 8, an HEMT device incorporating a barrier structure according to example aspects of the present disclosure experiences less dispersion after a stress condition. For instance, the pinch-off voltage shift decreases from about 0.8V in the example of FIG. 7 to about 0.4V in the example of FIG. 8. The current collapse decreases from about 34% in the example of FIG. 7 to less than 30%, such as about 26% in the example of FIG. 8.

Without being bound by any particular theory, the present inventors have discovered that the multilayer barrier structure according to example aspects of the present disclosure may lead to a reduction in electric field near the gate region of the HEMT device. This reduction in electric field near the gate region of the HEMT device leads to reduced dispersion of the HEMT device after stress conditions.

Figure 9A:
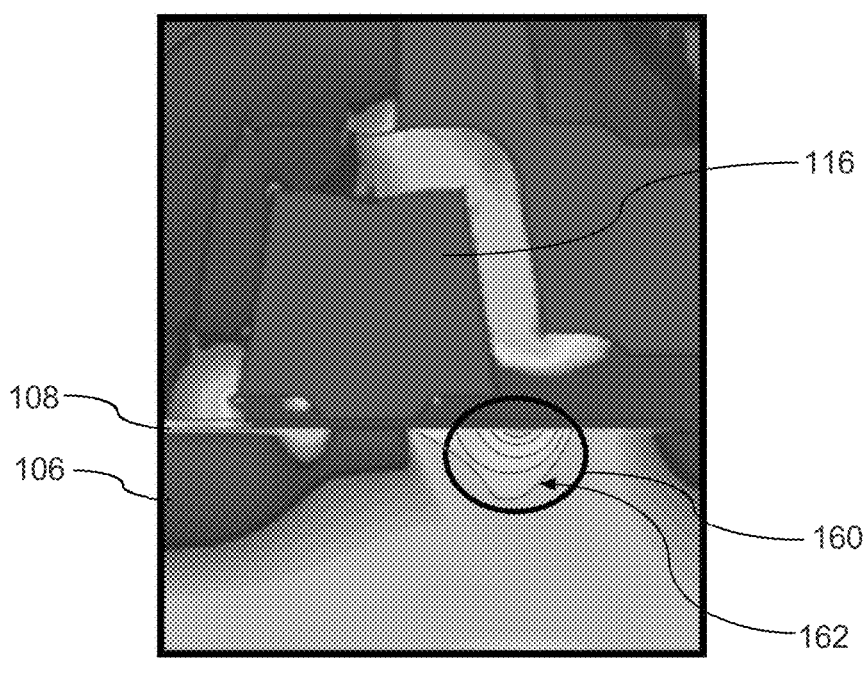
FIG. 9A depicts an electric field of a transistor device having a conventional barrier structure.

FIG. 9A depicts the electric field in an example HEMT device having a barrier structure similar to the conventional barrier structure 208 depicted in FIG. 7. FIG. 9A depicts a strong electric field 162 in the gate region 160 near gate region 160. Electric field lines have been added in the gate region 160 to represent electric field 162 for ease of illustration. The electric field 162 in the gate region 160 penetrates into the channel layer 106.

Figure 9B:
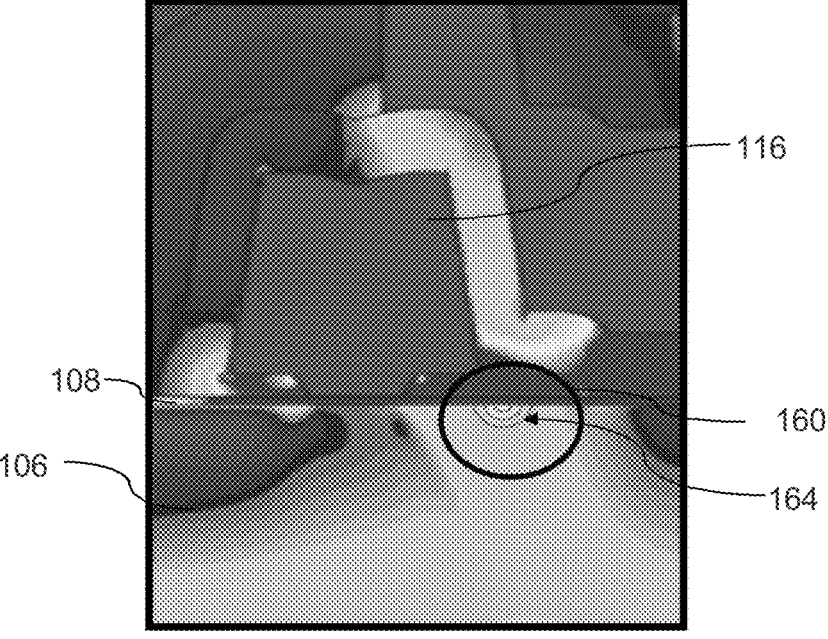
FIG. 9B depicts an electric field of a transistor device having a barrier structure according to example embodiments of the present disclosure.

FIG. 9B depicts the electric field in an example HEMT device having a barrier structure similar to the barrier structure 108 of FIG. 3 according to example aspects of the present disclosure. As shown in FIG. 9B, the electric field 164 in the same gate region 160 has been reduced. Electric field lines have been added in the gate region 160 to represent electric field 164 for ease of illustration. The strength of the electric field 164 is reduced relative to the electric field 162 and penetrates less deeply into the channel layer 106.

Example aspects of the present disclosure are described in the following paragraphs.

One example embodiment of the present disclosure is directed to a transistor device. The transistor device includes a channel layer. The transistor device includes a multilayer barrier structure on the channel layer. The multilayer barrier structure includes a first Group III-nitride layer and a second Group III-nitride layer on the first Group III-nitride layer and opposite to the channel layer. The first Group III-nitride layer has a thickness greater than a thickness of the second Group III-nitride layer. An aluminum concentration of the first Group III-nitride layer is at least two times greater than an aluminum concentration of the second Group III-nitride layer.

In some examples, the thickness of the second Group III-nitride layer or the aluminum concentration of the second Group III-nitride layer is such that a current collapse of the transistor device after a stress condition is about 30% or less at a 0V gate voltage relative to operation of the transistor device prior to the stress condition, wherein the stress condition comprises a 10-millisecond pulse of a 100V drain voltage and a −8V gate.

In some examples, the thickness of the second Group III-nitride layer or the aluminum concentration of the second Group III-nitride layer is such that a pinch-off voltage shift of the transistor device after a stress condition is about 0.4V or less at a 50V drain voltage relative to operation of the transistor device prior to the stress condition, wherein the stress condition comprises a 10-millisecond pulse of a 100V drain voltage and a −8V gate voltage.

In some examples, the aluminum concentration of the first Group III-nitride layer is at least five times greater than the aluminum concentration of the second Group III-nitride layer.

In some examples, an aluminum mole fraction of the first Group III-nitride layer is in a range of about 20% to about 100%. An aluminum mole fraction of the second Group III-nitride layer is in a range of about 1% to about 10%.

In some examples, a ratio of the thickness of the first Group III-nitride layer to the thickness of the second Group III-nitride layer is 4:1 or greater.

In some examples, the thickness of the first Group III-nitride layer is about 200 Angstroms to about 250 Angstroms and the thickness of the second Group III-nitride layer is about 50 Angstroms or less.

In some examples, the multilayer barrier structure includes an interface layer. The first Group III-nitride layer is disposed on the interface layer and opposite the channel layer. An aluminum concentration of the interface layer is greater than the aluminum concentration of the first Group III-nitride layer and the aluminum concentration of the second Group III-nitride layer. In some examples, a thickness of the interface layer is in a range of about 50 Angstroms or less.

In some examples, the transistor device includes a source contact and a drain contact on the multilayer barrier structure.

In some examples, the second Group III-nitride layer has a graded concentration of aluminum that increases such that the second Group III-nitride layer has a higher aluminum concentration at an interface between the first Group III-nitride layer and the second Group III-nitride layer relative to a surface of the second Group III-nitride layer opposite the first Group III-nitride layer.

In some examples, the transistor device has a cap layer on the multilayer barrier structure.

In some examples, the transistor device is a high electron mobility transistor. In some examples, the first Group III-nitride layer and the second Group III-nitride layer each comprise AlGaN. In some examples, the channel layer is disposed on a silicon carbide substrate.

Another example embodiment of the present disclosure is directed to a transistor device. The transistor device includes a channel layer. The transistor device includes a multilayer barrier structure on the channel layer. The multilayer barrier structure includes a first Group III-nitride layer and a second Group III-nitride layer on the first Group III-nitride layer and opposite to the channel layer. The first Group III-nitride layer has a thickness at least four times greater than a thickness of the second Group III-nitride layer. An aluminum concentration of the first Group III-nitride layer is greater than an aluminum concentration of the second Group III-nitride layer.

In some examples, the thickness of the second Group III-nitride layer or the aluminum concentration of the second Group III-nitride layer is such that a current collapse of the transistor device after a stress condition is about 30% or less at a 0V gate voltage relative to operation of the transistor device prior to the stress condition, where the stress condition comprises a 10-millisecond pulse of a 100V drain voltage and a −8V gate voltage.

In some examples, the thickness of the second Group III-nitride layer or the aluminum concentration of the second Group III-nitride layer is such that a pinch-off voltage shift of the transistor device after a stress condition is about 0.4V or less at a 50V drain voltage relative to operation of the transistor device prior to the stress condition, wherein the stress condition comprises a 10-millisecond pulse of a 100V drain voltage and a −8V gate voltage.

In some examples, the aluminum concentration of the first Group III-nitride layer is at least five times greater than the aluminum concentration of the second Group III-nitride layer.

In some examples, an aluminum mole fraction of the first Group III-nitride layer is in a range of about 20% to about 100%. An aluminum mole fraction of the second Group III-nitride layer is in a range of about 1% to about 10%.

In some examples, the thickness of the first Group III-nitride layer is about 200 Angstroms to about 250 Angstroms and the thickness of the second Group III-nitride layer is about 50 Angstroms or less.

In some examples, the multilayer barrier structure includes an interface layer. The first Group III-nitride layer is disposed on the interface layer and opposite the channel layer. An aluminum concentration of the interface layer is greater than the aluminum concentration of the first Group III-nitride layer and the aluminum concentration of the second Group III-nitride layer. In some examples, a thickness of the interface layer is in a range of about 50 Angstroms or less.

In some examples, the transistor device includes a source contact and a drain contact on the multilayer barrier structure.

In some examples, the second Group III-nitride layer has a graded concentration of aluminum such that the second Group III-nitride layer has a higher aluminum concentration at an interface between the first Group III-nitride layer and the second Group III-nitride layer relative to a surface of the second Group III-nitride layer opposite the first Group III-nitride layer.

In some examples, the transistor device includes a cap layer on the multilayer barrier structure.

In some examples, the transistor device is a high electron mobility transistor. In some examples, the first Group III-nitride layer and the second Group III-nitride layer each comprise AlGaN. In some examples, the channel layer is disposed on a silicon carbide substrate.

Another example embodiment of the present disclosure is directed to a transistor device. The transistor device includes a channel layer. The transistor device includes a multilayer barrier structure on the channel layer. The multilayer barrier structure includes a first layer on the channel layer, a second layer on the first layer, and a third layer on the second layer. The first layer is an $Al_xGa_{1-x}N$ layer where $x \geq 0.5$. The second layer is $Al_yGa_{1-y}N$ layer where $0.2 \leq y < 1$. The third layer is an $Al_zGa_{1-z}N$ layer where $0 < z \leq 0.1$.

In some examples, a ratio of a thickness of the second layer to a thickness of the third layer is 4:1 or greater.

In some examples, a thickness of the second layer is about 200 Angstroms to about 250 Angstroms and a thickness of the third layer is about 50 Angstroms or less.

In some examples, the transistor device includes a source contact and a drain contact on the multilayer barrier structure.

In some examples, $x \geq 0.7$.

Another example embodiment of the present disclosure is directed to a transistor device. The transistor device includes a channel layer. The transistor device includes a multilayer Group III-nitride based barrier structure on the channel layer. The multilayer Group III-nitride based barrier structure includes a first layer and a second layer on the first layer. A thickness of the second layer or an aluminum concentration of the second layer is such that a current collapse of the transistor device after a stress condition is about 30% or less at a 0V gate voltage relative to operation of the transistor device prior to the stress condition, where the stress condition includes a 10-millisecond pulse of a 100V drain voltage and a −8V gate voltage.

In some examples, a thickness of the second layer or the aluminum concentration of the second layer is such that a pinch-off voltage shift of the transistor device after the stress condition is about 0.4V or less at a 50V drain voltage relative to operation of the transistor device prior to the stress condition.

In some examples, a ratio of a thickness of the first layer to a thickness of the second layer is about 4:1.

In some examples, an aluminum concentration of the first layer is at least two times greater than the aluminum concentration of the second layer at an interface between the first layer and the second layer.

Another example embodiment of the present disclosure is directed to a transistor device. The transistor device includes a channel layer. The transistor device includes a multilayer Group III-nitride based barrier structure on the channel layer. The multilayer Group III-nitride based barrier structure includes a first layer and a second layer on the first layer. A thickness of the second layer or an aluminum concentration of the second layer is such that a pinch-off voltage shift of the transistor device after a stress condition is about 0.4V or less at a 50V drain voltage relative to operation of the transistor device prior to the stress condition, where the stress condition comprises a 10-millisecond pulse of a 100V drain voltage and a −8V gate voltage.

In some examples, wherein a ratio of a thickness of the first layer to a thickness of the second layer is about 4:1.

In some examples, an aluminum concentration of the first layer is at least two times greater than the aluminum concentration of the second layer at an interface between the first layer and the second layer.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A transistor device, comprising:
a channel layer; and
a multilayer barrier structure on the channel layer, the multilayer barrier structure comprising a first Group III-nitride layer and a second Group III-nitride layer on the first Group III-nitride layer and opposite to the channel layer, the first Group III-nitride layer having a thickness greater than a thickness of the second Group III-nitride layer, wherein an aluminum concentration of the first Group III-nitride layer is at least two times greater than an aluminum concentration of the second Group III-nitride layer;
wherein the thickness of the second Group III-nitride layer is about 50 Angstroms or less and a ratio of the thickness of the first Group III-nitride layer to the thickness of the second Group III-nitride layer is greater than 4:1.

2. The transistor device of claim 1, wherein the thickness of the second Group III-nitride layer is about 50 Angstroms or less, and the aluminum concentration of the second Group III-nitride layer is about 1% to about 10%, such that a current collapse of the transistor device after a stress condition is about 30% or less at a 0V gate voltage relative to operation of the transistor device prior to the stress condition, wherein the stress condition comprises a 10-millisecond pulse of a 100V drain voltage and a −8V gate voltage.

3. The transistor device of claim 1, wherein the aluminum concentration of the first Group III-nitride layer is at least five times greater than the aluminum concentration of the second Group III-nitride layer.

4. The transistor device of claim 1, wherein an aluminum mole fraction of the first Group III-nitride layer is in a range of about 20% to about 100%.

5. The transistor device of claim 4, wherein an aluminum mole fraction of the second Group III-nitride layer is in a range of about 1% to about 10%.

6. The transistor device of claim 1, wherein the thickness of the first Group III-nitride layer is over 200 Angstroms to about 250 Angstroms.

7. The transistor device of claim 1, wherein the multilayer barrier structure comprises an interface layer, the first Group III-nitride layer being disposed on the interface layer and opposite the channel layer, wherein an aluminum concentration of the interface layer is greater than the aluminum concentration of the first Group III-nitride layer and the aluminum concentration of the second Group III-nitride layer.

8. The transistor device of claim 7, wherein a thickness of the interface layer is in a range of about 50 Angstroms or less.

9. The transistor device of claim 1, further comprising a source contact and a drain contact on the multilayer barrier structure.

10. The transistor device of claim 1, wherein the second Group III-nitride layer has a graded concentration of aluminum that increases such that the second Group III-nitride layer has a higher aluminum concentration at an interface between the first Group III-nitride layer and the second Group III-nitride layer relative to a surface of the second Group III-nitride layer opposite the first Group III-nitride layer.

11. The transistor device of claim 1, further comprising a cap layer on the multilayer barrier structure.

12. The transistor device of claim 1, wherein the transistor device is a high electron mobility transistor.

13. The transistor device of claim 1, wherein the channel layer is disposed on a silicon carbide substrate.

14. A transistor device, comprising:
a channel layer; and
a multilayer barrier structure on the channel layer, the multilayer barrier structure comprising a first Group III-nitride layer and a second Group III-nitride layer on the first Group III-nitride layer and opposite to the channel layer, the first Group III-nitride layer having a thickness at least four times greater than a thickness of the second Group III-nitride layer, wherein an aluminum concentration of the first Group III-nitride layer is greater than an aluminum concentration of the second Group III-nitride layer;
wherein the thickness of the second Group III-nitride layer is about 50 Angstroms or less and a ratio of the thickness of the first Group III-nitride layer to the thickness of the second Group III-nitride layer is greater than 4:1.

15. The transistor device of claim 14, wherein the thickness of the second Group III-nitride layer is about 50 Angstroms or less, and the aluminum concentration of the second Group III-nitride layer is about 1% to about 10%, such that a pinch-off voltage shift of the transistor device after a stress condition is about 0.4V or less at a 50V drain voltage relative to operation of the transistor device prior to the stress condition, wherein the stress condition comprises a 10-millisecond pulse of a 100V drain voltage and a −8V gate voltage.

16. The transistor device of claim 14, wherein the multilayer barrier structure comprises an interface layer, the first Group III-nitride layer being disposed on the interface layer and opposite the channel layer, wherein an aluminum concentration of the interface layer is greater than the aluminum concentration of the first Group III-nitride layer and the aluminum concentration of the second Group III-nitride layer.

17. The transistor device of claim 16, wherein a thickness of the interface layer is in a range of about 50 Angstroms or less.

18. The transistor device of claim 14, wherein the aluminum concentration of the first Group III-nitride layer is at least two times greater than the aluminum concentration of the second Group III-nitride layer.

19. A transistor device, comprising:
a channel layer; and
a multilayer barrier structure on the channel layer, the multilayer barrier structure comprising a first layer on the channel layer, a second layer on the first layer, and a third layer on the second layer;
wherein the first layer is an $Al_xGa_{1-x}N$ layer where $x \geq 0.5$;
wherein the second layer is $Al_yGa_{1-y}N$ layer where $0.2 \leq y < 1$;
wherein the third layer is an $Al_zGa_{1-z}N$ layer where $0 < z \leq 0.1$;
wherein a ratio of a thickness of the second layer to a thickness of the third layer is 4:1 or greater.

20. The transistor device of claim 19, further comprising a silicon carbide substrate.

21. A transistor device, comprising:
a channel layer; and
a multilayer Group III-nitride based barrier structure on the channel layer, the multilayer Group III-nitride based barrier structure comprising a first layer and a second layer on the first layer, wherein a thickness of the second layer or an aluminum concentration of the second layer is such that a current collapse of the transistor device after a stress condition is about 30% or less at a 0V gate voltage relative to operation of the transistor device prior to the stress condition, wherein the stress condition comprises a 10-millisecond pulse of a 100V drain voltage and a −8V gate voltage;
wherein the thickness of the second layer is about 50 Angstroms or less and a ratio of the thickness of the first Group III-nitride layer to the thickness of the second Group III-nitride layer is greater than 4:1.

22. The transistor device of claim 21, wherein an aluminum concentration of the first layer is at least two times greater than the aluminum concentration of the second layer at an interface between the first layer and the second layer.

23. A transistor device, comprising:
a channel layer; and
a multilayer Group III-nitride based barrier structure on the channel layer, the multilayer Group III-nitride based barrier structure comprising a first layer and a second layer on the first layer, wherein a thickness of the second layer or an aluminum concentration of the second layer is such that a pinch-off voltage shift of the transistor device after a stress condition is about 0.4V or less at a 50V drain voltage relative to operation of the transistor device prior to the stress condition, wherein the stress condition comprises a 10-millisecond pulse of a 100V drain voltage and a −8V gate voltage;

wherein the thickness of the second layer is about 50 Angstroms or less and a ratio of the thickness of the first Group III-nitride layer to the thickness of the second Group III-nitride layer is greater than 4:1.

24. The transistor device of claim 23, wherein an aluminum concentration of the first layer is at least two times greater than the aluminum concentration of the second layer at an interface between the first layer and the second layer.

\* \* \* \* \*